United States Patent [19]

Clinton

[11] 4,241,304

[45] Dec. 23, 1980

[54] CONTINUOUS CONTINUITY MONITOR FOR MONITORING THE CONTINUITY OF AN INSULATED WIRE CONDUCTOR

[76] Inventor: Henry H. Clinton, 10 Shore Rd., Clinton, Conn. 06413

[21] Appl. No.: 37,444

[22] Filed: May 9, 1979

[51] Int. Cl.³ .................................................. G01R 31/02
[52] U.S. Cl. .................................................... 324/51
[58] Field of Search .................. 324/51, 52, 54, 60 R, 324/61 R

[56] References Cited

U.S. PATENT DOCUMENTS

| | | | |
|---|---|---|---|
| 3,096,478 | 7/1963 | Brown | 324/54 |
| 3,241,061 | 3/1966 | Quittner | 324/61 R |
| 3,374,428 | 3/1968 | Eager et al. | 324/54 |
| 3,418,570 | 12/1968 | Clinton | 324/54 |
| 3,555,413 | 1/1971 | Matsuba | 324/54 |
| 3,628,133 | 12/1971 | Dornberger | 324/52 |
| 3,763,426 | 10/1973 | Wilkes | 324/52 X |
| 3,919,635 | 11/1975 | Bowen et al. | 324/54 |
| 4,056,771 | 11/1977 | Clinton et al. | 324/54 |

*Primary Examiner*—Gerard R. Strecker

*Attorney, Agent, or Firm*—McCormick, Paulding & Huber

[57] ABSTRACT

A continuous continuity monitor checks the continuity of an electrically insulated wire as the wire is moved axially of itself through the monitor, and provides an appropriate signal whenever a break in a conductor within the wire is detected. The monitor employs two detecting electrodes spaced along the wire and an excitation electrode to which a high frequency voltage is applied. The conductor within the wire is grounded at one side of the detecting electrodes opposite from the excitation electrode to complete a capacitive circuit with the excitation electrode. As the wire is moved past the electrodes, the same excitation voltage is capacitively coupled from the conductor to the two detecting electrodes as long as there is no break in continuity. When a break appears in the conductor between the two detecting electrodes, one of the electrodes closest to the excitation electrode detects the excitation voltage to a greater extent than the other, and disturbs the voltage balance between the two detecting electrodes. The unbalanced voltages are used to trigger an alarm signal or to generate a signal for either marking the insulated wire at the break or terminating continuity testing.

17 Claims, 3 Drawing Figures

CONTINUOUS CONTINUITY MONITOR FOR MONITORING THE CONTINUITY OF AN INSULATED WIRE CONDUCTOR

BACKGROUND OF THE INVENTION

The present invention relates to an apparatus for testing the continuity of insulated wires that contain one or more electrical conductors. In particular, the continuity monitor of the present invention is concerned with a testing apparatus that inspects a constantly moving insulated wire as the wire passes an inspection station without sensitivity to the speed of wire movement.

During a continuous process of manufacturing an insulated wire, it is desirable to detect a loss of electrical continuity as the wire passes an inspection station. Preferably, a continuity testing device provides an alarm signal or other signal whenever an incremental length of the wire containing a broken conductor enters the inspection station so that a machine operator can be alerted to the defect, or so that machinery handling the wire can automatically reject and set aside that length of the wire containing a fault. Alternatively, such a signal may be used to mark the wire at the area where a fault has been detected for subsequent processing or removal.

Previously continuity detectors for detecting breaks in insulated wires used eddy current principles with only moderate success. Eddy current detectors are sensitive to the speed of a moving wire, and in a process in which an extended length of wire is manufactured, the speed of movement is sometimes difficult to maintain at a fixed level. Moreover, eddy current detectors require careful adjustment of several controls in order to secure the required sensitivity for detection. Such adjustments are not usually considered to be within the capabilities of a machine operator in an industrial environment.

Accordingly, it is an object of the present invention to provide a continuous continuity monitor for detecting breaks within a moving wire without sensitivity to wire speed. It is a further object of the invention to provide a continuity monitor that is simple in design and which does not require specialized adjustments by the machine operator in order to maintain the sensitivity required for detecting breaks in continuity.

SUMMARY OF THE INVENTION

The present invention resides in an apparatus for monitoring the continuity of an insulated wire as the monitored wire is moved axially of itself along a path relative to a monitoring station.

The apparatus includes first and second monitoring electrodes positioned adjacent the path and the moving wire at the monitoring station. The first electrode is spaced axially along the wire relative to the second electrode, and each electrode is reactively coupled with the respective portions of the conducting element or conductor within the wire adjacent the electrodes.

Excitation means for inducing an electrical excitation in the conductor of the wire is positioned along said path at one side of the monitoring station. The excitation means is coupled with the conductor within the wire and is preferably comprised by a high frequency voltage source and a further electrode capacitively coupled with the conductor within the wire. The first and second monitoring electrodes and the electrode of the excitation means are thus located at serial positions along the monitored wire.

Circuit completing means are coupled to the one end of the conductor of the monitored wire at a position on the opposite side of the monitoring station from the coupling with the excitation means. Thus, a circuit is completed through the portion of the monitored element adjacent the two monitoring electrodes when continuity exists.

Detecting means are connected with the two monitoring electrodes for detecting a difference in the electrical excitations coupled to the electrodes from the conductor whenever a break in the element appears in the portion of the wire extending between the two monitoring electrodes. The detector means is utilized to develop a warning or other signal that identifies the detected break in continuity.

The monitoring apparatus does not rely upon eddy current principles and is insensitive to changes in speed of the monitored wire at the inspection station containing the two detecting electrodes. The apparatus is relatively simple in design and does not require careful adjustment of controls in order to maintain the required sensitivity during a monitoring operation.

DESCRIPTION OF THE PREFERRED EMBODIMENTS

Figure 1:
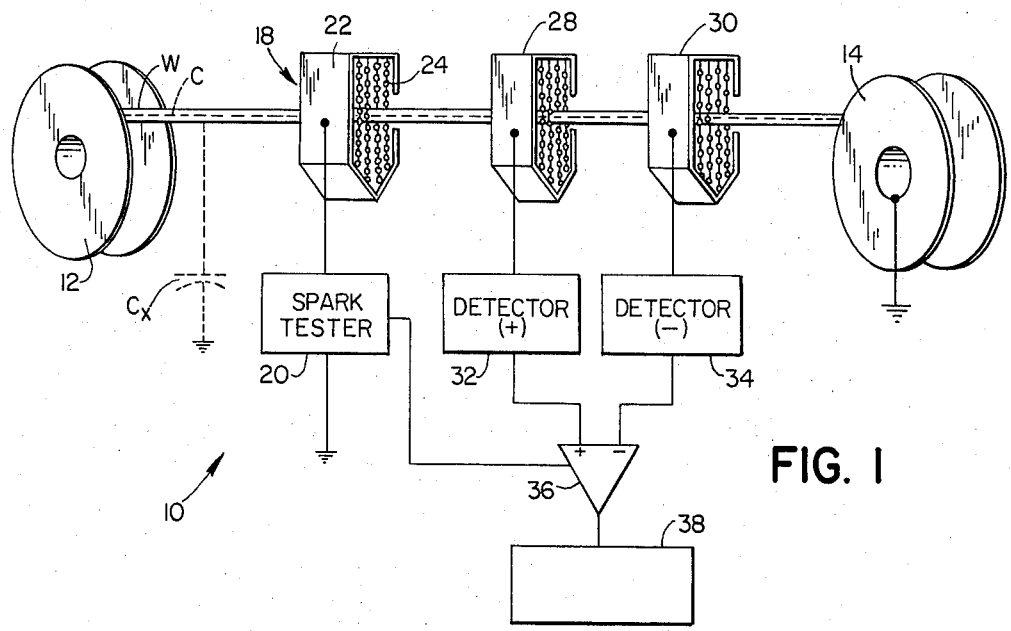
FIG. 1 is a schematic illustration of the apparatus for monitoring continuity in accordance with the present invention.

FIG. 1 illustrates a continuous continuity monitor, generally designated 10, for detecting breaks in the continuity of a conducting element or conductor c within an electrically insulated wire w. The wire w may contain more than one conductor c within an insulated covering, and the continuity of each conductor is monitored by the apparatus 10 in a single inspection operation. For simplicity, the invention will be described in the context of a wire having a single conductor enveloped by an outer layer of electrical insulation.

The wire w extends between a supply reel 12 on which the wire had been previously wound from a wire coating machine and a takeup reel 14. Alternatively, the wire may be supplied directly from a coating machine to the takeup reel 14. The takeup reel 14 is driven by a motor (not shown) and draws the wire w from the supply reel at a selected speed so that the wire moves axially of itself along a path between the two reels. The speed of movement of the wire may vary during the course of an inspection operation without affecting the operation of the monitoring apparatus 10. To maintain the wire w in position as it moves between the two reels, a slight drag force may be imposed upon the supply reel 12 and additional guides may be employed.

In passing from the supply reel 12, the wire w first moves through an excitation electrode 18 of a spark tester 20. The spark tester includes a high frequency voltage source that applies an alternating voltage to the electrode 18 surrounding the wire w. For example, the tester may generate a voltage ranging between 1500 and 15,000 volts (rms) at 3,000 hertz. The voltage is applied to the electrode 18 which is constructed with a c-shaped metallic housing 22 in which a plurality of steel bead chains 24 are suspended in a high density array. The steel chains are draped about the wire so that contact with the insulating layer on the exterior of the wire is maintained on a substantial portion of the wire surface. The intimate contact of the chains and wire also provides capacitive coupling with the conductor c within the wire.

The conductor c within the wire w is connected to the same ground as the spark tester 20 through the circuit completing takeup reel 14. In the event that a bare wire interval or pin hole fault in the insulation on the conductor appears within the electrode 18, a discharge occurs from the spark tester to the conductor, and the discharge is detected by the tester and produces a warning signal to advise the machine operator of the insulation fault. For more details concerning the spark tester, reference may be had to U.S. Pat. No. 3,418,570 issued to H. Clinton.

The wire w passes from the excitation electrode 18 through two detecting or monitoring electrodes 28 and 30. The detecting electrodes have substantially the same steel bead chain construction as the excitation electrode 18 although they are generally somewhat smaller. The electrodes 28 and 30 are located at spaced stations along the path followed by the wire between the electrode 18 and the grounded takeup reel 14. The capacitive coupling of the conductor c with the electrodes 28 and 30 enables the electrodes to detect voltages carried by the conductor as it passes within the respective electrodes.

It will be observed from FIG. 1 that the high frequency potential from the spark tester coupled to the insulated wire w through the capacitance of electrode 18 causes an AC current flow in the wire. The circuit from the spark tester for this current reaches ground through both the takeup reel 14 and through the capacitance Cx between the wire and surrounding objects connected to ground.

If the wire w has continuity throughout the portion extending from the spark tester 20 to the takeup reel 14, the same voltage will be present on those portions of the wire within each of the detecting electrodes 28 and 30 and, consequently, equal voltages will be coupled to the detecting electrodes. The voltages are transmitted from the electrodes 28 and 30 to the respective voltage detector circuits 32 and 34, and the output voltages of the two detector circuits are applied to a comparator 36. As long as the compared voltages are approximately the same, the comparator output remains at a predetermined or quiescent level.

In the event that a portion of the wire w with a broken conductor appears in the space between the detecting electrodes 28 and 30, the voltage level on the segment of broken conductor closest to the spark tester will be greater than that on the portion extending from the break through the detecting electrode 30 to the takeup reel 14. This voltage difference is caused by the break in the capacitive circuit connecting the excitation electrode 18 through the wire to ground. When the break is between the detecting electrodes, the electrode 28 is exposed to the higher voltage coupled to the wire by the electrode 18 and the electrode 30 is exposed to the lower voltage associated with the connection to ground through the takeup reel.

The voltage differential of the two detecting electrodes caused by the intervening break produces a difference in the outputs from the detectors 32 and 34, and the comparator 36 responding to the difference produces an actuating signal that is applied to a warning device 38 such as a blinking light or alarm horn. The actuating signal could also be applied to a disabling circuit that would disengage power to the takeup reel 14 and simultaneously apply a brake to the wire so that that portion of the wire which contained the break in continuity could be immediately identified and removed from the wire if desired. Still further, the actuating signal from the comparator 36 could energize a marking tool such as a spray gun that would mark that section of the wire which contained the break for subsequent identification and removal.

Figure 2:
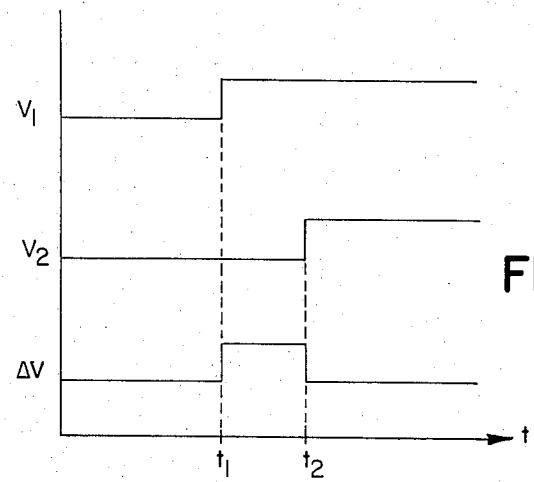
FIG. 2 is a series of voltage diagrams illustrating voltage levels in the detection circuit when a break in continuity is detected in the monitored wire.

FIG. 2 illustrates the rms voltages that are generated on the detecting electrodes 28 and 30 as a break in the conductor c passes through the monitoring station formed by the electrodes. The voltage V1 represents the voltage on the upstream electrode 28 and the voltage V2 represents the voltage on the downstream electrode 30. Voltage V1 increases at a time t1 as the break in the conductor moves downstream of the electrode 28 and the voltage V2 increases at a later time t2 as the break passes downstream of the electrode 30. During the interval in which the break lies between the electrodes 28 and 30, the comparator 36 detects the difference $\Delta V$ between the voltages on the electrodes 28 and 30 as developed by the detector circuits 32 and 34. That difference $\Delta V$ is sensed by the comparator 36 and generates an actuating signal applied to the warning device 38. Because the wire may be moving at a high rate of speed through the monitoring station, the period between t1 and t2 may be relatively short. Under such circumstances the actuating signal is relatively brief and it is therefore desirable that the warning device 38 latch in the alarm condition when actuated.

Figure 3:
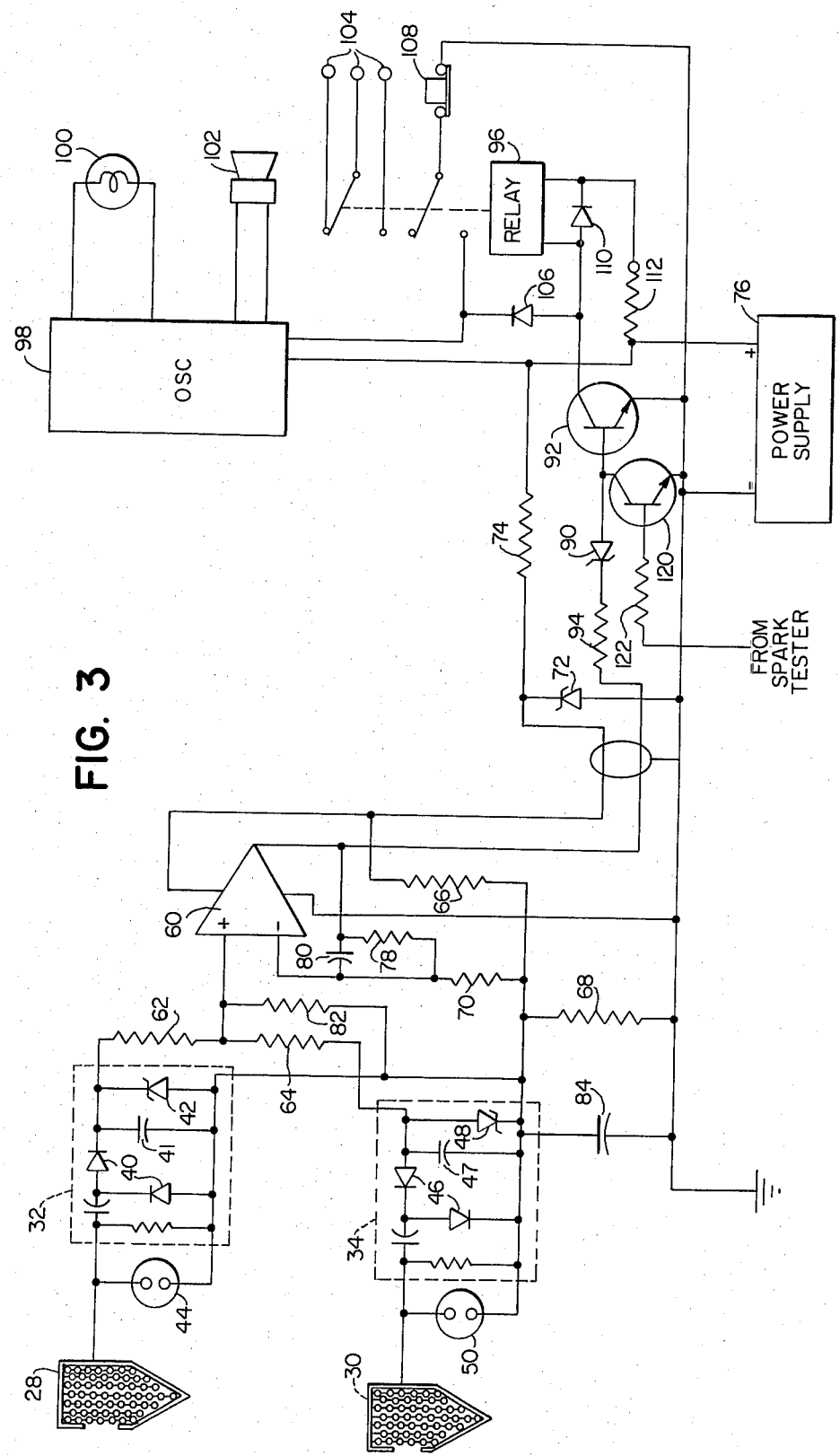
FIG. 3 is an electrical diagram illustrating one embodiment of the monitoring apparatus in detail.

A more detail disclosure of the detection portion of the continuous continuity monitor is shown in FIG. 3. Where appropriate, items previously described in FIG. 1 bear the same reference numerals.

The detecting electrode 28 is connected to the diode detector 32 which is a half wave rectifier containing diodes 40, a filtering capacitor 41 and a zener diode 42 for protection of the remaining circuit components. A gas discharge tube 44 with a drain resistor is also provided to protect the rectifier from high voltage transients and bare wire contact.

In a somewhat similar manner, the detecting electrode 30 is conncted to the diode detector 34 which is also a half wave rectifier containing a diodes 46, a filtering capacitor 47 and protective zener diode 48. A gas discharge tube 50 with a drain resistor protects the rectifying elements. It will be observed from the positioning of the diodes in the two half wave rectifiers that the output of the detector 32 is a positive DC voltage while the output of detector 34 is negative. These DC voltages are both applied in opposed relationship to the noninverting input of a differential amplifier 60 through the coupling resistors 62 and 64. The inverting input of the differential amplifier is connected to a reference voltage from a voltage dividier comprised by resistors 66 and 68 through a coupling resistor 70. The voltage dividing resistors are connected across a regulated voltage established by zener diode 72 and resistor 74 connected to a power supply 76. The resistor 82 couples the reference voltage to the noninverting input of the amplifier for biasing by the detector voltages. Negative feedback from the output of the differential amplifier 60 is provided by the resistor 78 and capacitor 80 connected to the inverting input. The capacitor 84 provides noise suppresion.

The voltage levels at the inputs of amplifier 60 and the gain established by the feedback components are selected so that the output of the amplifier under quiescent conditions, that is in the absence of any break in continuity, is below the breakdown voltage of a zener diode 90 connected to the base of transistor 92 through resistor 94. When a break in continuity appears between the electrodes 28 and 30, the output of amplifier 60 is driven above the breakdown voltage and biases transistor 92 into a conductive state. The relay 96 closes the circuit to oscillator 98 and causes the warning light 100 and alarm horn 102 to provide visual and audible warning signals respectively. An additional pair of contacts 104 associated with the relay 96 may be used to energize a marking instrument positioned adjacent to the wire at the monitoring station or to deenergize the motor driving the takeup reel 14 so that the wire motion stops.

The diode 106 protects the transistor 92 against the reactance of the warning horn 102 and also latches the relay 96 in its operative condition through the closed contacts of the relay and release button 108. Thus, as a break in the wire passes beyond the monitoring station occupied by electrodes 28 and 30, the actuating signal from amplifier 60 disappears, but the oscillator 98 and alarm signals from the light 100 and horn 102 continue until the machine operator is aware of the detected break and presses the release button 108.

The diode 110 protects the transistor 92 against the reactance of relay 96 and the resistor 112 establishes the voltage potential necessary to operate the oscillator 98, the light 100 and the horn 102.

A discharge produced by the spark tester 20 each time an insulation fault appears in the wire w, may adversely unbalance the voltages sensed by the detecting electrodes 28 and 30. For this reason a disabling transistor 120 is connected between the base and emitter of transistor 92. A fault signal from the spark tester is applied to the base of transistor 120 through a resistor 122 and causes any spurious signals transmitted to the transistor 92 to be shunted. In this manner false alarm signals from the continuity tester are suppressed.

In summary, a continuous continuity monitor as been disclosed for detecting breaks in the conductor of a single- or multi- conductor wire. The monitor employs two spaced detecting electrodes 28 and 30 to detect voltage differentials caused by a continuity break that appears between the electrodes. Detecting breaks in this manner effectively eliminates any sensitivity of the apparatus to variations in speed of the wire relative to the electrodes. No sensitivity adjustments are required of the machine operator, and relatively simple electrical circuits and components are employed.

While the present invention has been described in a preferred embodiment, it should be understood that numerous modifications and substitutions can be had without departing from the spirit of the invention. For example, the relative movement of the wire past the electrodes 18, 28 and 30 could be reversed from that described in connection with FIG. 1, and the operation of the monitoring apparatus would not be affected. It is merely necessary that the spark tester creating the excitation voltage be positioned adjacent the ungrounded end of the wire. The spark tester itself need not perform the insulation test as suggested above, but may merely be provided for purposes of the continuity monitoring. The voltages and frequencies mentioned are not critical and may be adjusted within a broad range of values. Accordingly, the present invention has been described in a preferred embodiment by way of illustration rather than limitation.

I claim:

1. Apparatus for monitoring the continuity of an electrically insulated wire having an electrical conductor comprising:

means for moving the insulated wire axially of itself along a path past a monitoring station;

first and second monitoring electrodes positioned adjacent the path and the wire at the monitoring staton, and located serially along the path, each electrode being reactively coupled respectively with the portion of the electrical conductor adjacent the electrodes;

excitation means positioned along said path for inducing an electrical excitation voltage at an excitation frequency in the electrical conductor of the monitored wire, the excitation means having a reactive coupling with the conductor at one side of the monitoring station whereby the excitation means and the first and second electrodes communicate with the conductor at serial positions along the monitored wire;

circuit completing means electrically connecting the excitation means with the conductor at the opposite side of the monitoring station from said reactive coupling independently of the coupling and the portion of the conductor at the monitoring station for establishing a complete electrical circuit from the excitation means through the portion of the conductor adjacent the two monitoring electrodes and producing a detectable voltage at the excitation frequency on the conductor portion at the monitoring station when continuity exists; and detector means connected with the two monitoring electrodes for detecting different electrical voltages at the excitation frequency in the electrical conductor portions adjacent the respective first and second electrodes in the presence of a continuity break in the portion of the conductor between the first and second electrodes.

2. Apparatus for monitoring the continuity of an insulated wire as defined in claim 1 wherein the first and second electrodes are capacitively coupled electrodes for developing electrical signals according to the voltages on the portions of the conductor adjacent the electrodes.

3. Apparatus for monitoring the continuity of an insulated wire as defined in claim 2 wherein each of the first and second monitoring electrodes includes a metallic member extending at least partially around the wire.

4. Apparatus for monitoring the continuity of an insulated wire as defined in claim 1 further including an actuating means responsive to the detecting means for effecting further operations in response to a detected break in continuity.

5. Apparatus for monitoring as defined in claim 4 further including warning means connected with and energized by the actuating means for generating a warning signal in the presence of a detected break.

6. Apparatus for monitoring the continuity of an insulated wire as defined in claim 1 wherein the detecting means includes means connected with the first and second electrodes for comparing electrical voltages manifested by the electrodes through the reactive coupling with the electrical conductor adjacent the electrodes, and producing a signal upon the occurrence of a predetermined difference in the electrical voltages.

7. Apparatus for monitoring conductor continuity as defined in claim 6 wherein the detector means comprises a first voltage detector connected with the first electrode and a second voltage detector connected with the second electrode, and the comparing means comprises a voltage comparator connected with each of the voltage detectors.

8. Apparatus for monitoring the continuity of an insulated wire as defined in claim 1 wherein the excitation means comprises an alternating voltage source and the coupling comprises a third electrode connected to the source and positioned along said path adjacent the wire at said one side of the monitoring station having the first and second monitoring electrodes.

9. Apparatus for monitoring as defined in claim 8 wherein the excitation means comprises a high frequency voltage source capable of generating a spark discharge between the third electrode and the conductor in the absence of an insulation coating on the wire.

10. Apparatus for monitoring as defined in claim 8 wherein the alternating current source and the circuit completing means coupled to the electrical conductor are connected to a common ground.

11. A continuous continuity monitor for an electrically insulated wire comprising:
a first excitation electrode positioned adjacent the wire in capacitively coupled relationship at a first station along the insulated wire;
a high frequency voltage source connected with the first electrode for exciting the first electrode in capacitively coupled relationship with the wire;
a second, detecting electrode positioned adjacent the wire in capacitively coupled relationship at a second station along the insulated wire;
a third, detecting electrode positioned adjacent the wire in capacitively coupled relationship at a third station along the wire;
the second and third stations and the detecting electrodes being positioned serially along the wire between one end of the wire and the first station with the excitation electrode;
common grounding means connected with said one end of the wire and the high frequency voltage source whereby a complete electrical circuit exists from the high frequency voltage source through the portion of the wire between said one end and the first station when continuity exists in said portion of the wire;
comparator means connected with the detecting electrodes at the second and third stations for detecting a voltage different between the second and third electrodes at the frequency of the high frequency voltage source when a break in the continuity of the wire appears between the second and third stations; and
means for moving the wire and the serially positioned electrodes relative to one another for continuous continuity monitoring.

12. A continuous continuity monitor as defined in claim 11 wherein the second and third electrodes include steel bead chains contacting the insulated wire at the second and third stations.

13. A continuous continuity monitor as defined in claim 11 wherein the comparator means includes rectifiers connected respectively to the second and third electrodes and a d.c. amplifier responsive to the output voltages of the rectifiers.

14. A continuous continuity monitor as defined in claim 11 further including signaling means connected to the comparator means and responsive to the comparator means to provide a signal when a break in continuity is detected.

15. A continuous continuity monitor as defined in claim 14 wherein the high frequency voltage source comprises a spark tester for detecting insulation faults in the wire.

16. A continuous continuity monitor as defined in claim 15 further including means for disabling the signaling means in response to a detected insulation fault.

17. A continuous continuity monitor as defined in claim 11 wherein the high frequency voltage source comprises an insulation tester whereby both insulation and continuity monitoring are performed on the insulated wire.

* * * * *